(12) United States Patent
Suzuki (10) Patent No.: US 6,737,873 B2
(45) Date of Patent: May 18, 2004

(54) ELECTRONIC PART INSPECTION DEVICE (75) Inventor: Mitsuo Suzuki, Tokyo (JP)

(73) Assignee: Kel Corporation, Tokyo (JP)

( * ) Notice: Subject to any disclaimer, the term of this patent is extended or adjusted under 35 U.S.C. 154(b) by 0 days.

(21) Appl. No.: 09/978,290

(22) Filed: Oct. 15, 2001

(65) Prior Publication Data
US 2002/0050837 A1 May 2, 2002

(30) Foreign Application Priority Data
Oct. 26, 2000 (JP) ........................................ 2000-326623

(51) Int. Cl.[7] .......................... G01R 31/12; G01R 31/02
(52) U.S. Cl. ...................................... 324/548; 324/549
(58) Field of Search ................................. 324/537, 548, 324/549, 754, 755, 757, 758, 765

(56) References Cited

U.S. PATENT DOCUMENTS

| 3,710,303 | A | * | 1/1973 | Gallager, Jr. | 439/267 |
| 4,077,688 | A | * | 3/1978 | Cobaugh et al. | 439/267 |
| 4,576,427 | A | * | 3/1986 | Verbruggen | 439/267 |
| 4,744,768 | A | * | 5/1988 | Rios | 439/262 |
| 4,956,604 | A | * | 9/1990 | Cedrone | 324/754 |
| 5,023,544 | A | * | 6/1991 | Vallone et al. | 324/537 |

* cited by examiner

Primary Examiner—N. Le
Assistant Examiner—Timothy J. Dole
(74) Attorney, Agent, or Firm—Robert WJ Usher (57) ABSTRACT An electronic-part inspection device 20 comprises a plurality of terminals 30, a left terminal-retaining member 51 and a left swinging member 71, and each terminal 30 comprises a terminal base portion 31, a swinging arm portion 33, a contact portion 35 and an engaging portion 37. The terminal base portion 31 is located in the lower part of the terminal 30 and retained in the left terminal-retaining member 51, and the swinging arm portion 33 extends upward from the terminal base portion 31 and is capable of undergoing elastic deformation to swing back and forth. The contact portion 35 is located at the upper end of the swinging arm portion 33, and the engaging portion 37 is also located at the upper end of the swinging arm portion 33. The left terminal-retaining member 51 comprises base-receiving portions 58, which retain the terminal base portions 31 of the terminals 30, and a counter surface 63a provided on a middle wall 63 that exists in the base-receiving portions 58. Furthermore, the left swinging member 71 comprises pivotally engaging portions 71d, which are positioned behind and against the contact portions 35 of the terminals 30 and are engaged to the engaging portions 37 of the terminals 30.

8 Claims, 6 Drawing Sheets

ELECTRONIC PART INSPECTION DEVICE

FIELD OF THE INVENTION

The present invention generally relates to an electronic-part inspection device and more particularly to an electronic part inspection device used for inspecting electrical characteristics of a plurality of electronic parts such as chip capacitors, which are set in alignment.

BACKGROUND OF THE INVENTION

Generally, when a chip capacitor is assembled on a circuit board, the leads of the chip capacitor are removed, and the main body of the chip capacitor is placed directly on the circuit board, and then the ends of the main body are soldered to the circuit board. In production of chip capacitors, a plurality of chip capacitors are aligned at a predetermined pitch on a band-shaped plate material (carrier) in the longitudinal direction of the plate material and are produced in a lot (chip capacitors arranged on a plate material in such a condition are hereinafter collectively referred to as a "carrier with capacitors"). In this carrier with capacitors, one terminal of each chip capacitor is electrically connected with one terminals of the other chip capacitors, and these one terminals of the chip capacitors are retained on the carrier while the other terminals of the chip capacitors are not retained on the carrier but are kept in the air being electrically disconnected from the carrier. To examine the electrical characteristics of each chip capacitor (for example, capacitance C), while the one terminal of the chip capacitor is electrically grounded, the inspection terminal of an inspection device is electrically connected to the other terminal of the chip capacitor, and the electrical characteristics are measured between the terminals of the chip capacitor. If the measured results of the electrical characteristics are within predetermined ranges, then the examined chip capacitor is determined as normal. On the other hand, if the results are not within the predetermined ranges, then the chip capacitor is determined as defective.

Because of the small size of the terminals of the chip capacitor and of the limited space available between the consecutive chip capacitors, respectively, it is very difficult for an inspector to electrically connect the inspection terminal of the inspection device to the corresponding terminal of each chip capacitor. Therefore, there is a possibility that the terminal of a chip capacitor which is not intended for inspection may be used mistakenly in measurement for inspection instead of the terminal of an intended chip capacitor. Thus, there is a need for an electronic-part inspection device that enables easy and accurate inspection on electronic parts.

SUMMARY OF THE INVENTION

It is an object of the present invention to provide an electronic-part inspection device that enables easy and accurate measurements of electrical characteristics of chip capacitors retained in a carrier.

An electronic-part inspection device according to the present invention comprises a plurality of vertically extending terminals made of an electrically conductive material, a terminal-retaining member made of an electrically insulative material, which retains these terminals in a laterally extending alignment, and a swinging member made of an electrically insulative material, which also extends laterally and is connected pivotally on the terminal-retaining member so that the swinging member can be swung back and forth with respect to the terminal-retaining member. Each of the terminals comprises a terminal base portion, a swinging arm portion, a contact portion, and an engaging portion. The terminal base portion is the lower part of the terminal and is retained in the terminal-retaining member, and the swinging arm portion extends upward from the terminal base portion and is capable of undergoing elastic deformation to swing back and forth. The contact portion is located at the upper end of the swinging arm portion, and the engaging portion is also located at the upper end of the swinging arm portion. The terminal-retaining member comprises a terminal-retaining portion (for example, the base-receiving portions 58 described in the following embodiment) and a counter portion (for example, the counter surface 63a described in the following embodiment). The terminal-retaining portion retains the terminal base portions of the terminals, and the counter portion is connected to the terminal-retaining portion and located in front of the contact portions of the terminals. The swinging member, which has pivotally engaging portions to engage with the engaging portions of the terminals, is positioned behind and against the contact portions of the terminals. In this electronic-part inspection device, when the swinging member is tilted in a direction that causes the pivotally engaging portions of the swinging member to move away from the counter portion of the terminal-retaining member, the swinging arm portions of the terminals, which are engaged through the engaging portions of the terminals to the pivotally engaging portions of the swinging member, undergo an elastic deformation to bring the contact portions of the terminals away from the counter portion of the terminal-retaining member. As a result, a gap is created between the contact portions and the counter portion. Into this gap, the contact terminals of an electronic part are inserted, and then the swinging member is released from the tilted condition to allow the swinging arm portions in the elastic deformation to resume the original positions. When the swinging member is released, the contact portions of the terminals and the swinging member are returned toward the counter portion of the terminal-retaining member. As a result, the contact terminals of the electronic part are sandwiched between the contact portions of the terminals and the counter portion of the terminal-retaining member.

In this electronic-part inspection device, the swinging arm portions of the terminals are engaged to the swinging member, which can be swung back and forth. Therefore, when the swinging member is tilted in the direction that causes the pivotally engaging portions of the swinging member to move away from the counter portion of the terminal-retaining member, a gap is created between the contact portions of the terminals and the counter portion of the terminal-retaining member. The contact terminals of the electronic part are placed in this gap, and then the swinging member is released from the tilted condition to let the contact portions of the terminals return toward the counter portion of the terminal-retaining member. In this way, the contact terminals of the electronic part are sandwiched between the contact portions and the counter portion, with the electronic part being electrically connected to the terminals of the inspection device. In a case of the electronic part being a chip capacitor, which is small in size, a plurality of chip capacitors are aligned at a relatively short pitch on a carrier, and the contact terminals of the chip capacitors retained on the carrier are then easily connected electrically to the terminals of the electronic-part inspection device.

Another electronic-part inspection device according to the present invention comprises a plurality of vertically extending terminals made of an electrically conductive material, a terminal-retaining member made of an electrically insulative material, which retains the terminals in a laterally extending alignment, and a swinging member made of an electrically insulative material, which also extends laterally and is connected pivotally on the terminal-retaining member so that the swinging member can be swung back and forth with respect to the terminal-retaining member. In this case, each terminal comprises a terminal base portion, a first swinging arm portion, a contact portion and a second swinging arm portion. The terminal base portion extends in the front and rear direction in the lower part of the terminal and is retained in the terminal-retaining member, and the first swinging arm portion extends upward from the upper front end of the terminal base portion and is capable of undergoing elastic deformation for swinging. The contact portion is located at the upper end of the first swinging arm portion. The second swinging arm portion extends upward from the upper rear end of the terminal base portion and is capable of undergoing elastic deformation for swinging. The terminal-retaining member comprises a terminal-retaining portion to retain the terminal base portions of the terminals, and the swinging member comprises holding portions, which are positioned behind and against the contact portions of the terminals, and a pressing portion (for example, the pressing surface 85 described in the following embodiment), which is positioned in front of and against the second swinging arm portions. In this electronic-part inspection device, when the swinging member is tilted in a direction that causes the holding portions of the swinging member to move away from the first swinging arm portions of the terminals, the second swinging arm portions of the terminals, which are pushed by the pressing portion of the swinging member, undergo an elastic deformation to bring the holding portions away from the contact portions of the terminals. As a result, a gap is created between the contact portions of the terminals and the holding portions of the swinging member. Into this gap, the contact terminals of an electronic part are inserted, and then the swinging member is released from the tilted condition to allow the second swinging arm portions in the elastic deformation to resume the original positions. In this instance, the swinging member, whose pressing portion is pushed by the second swinging arm portions toward the contact portions of the terminals, is returned toward the first swinging arm portions of the terminals. As a result, the contact terminals of the electronic part are sandwiched between the contact portions of the terminals and the holding portions of the swinging member.

In this electronic-part inspection device, each of the terminals is provided with the second swinging arm portion, which resiliently supports a corresponding holding portion of the swinging member, in addition to the first swinging arm portion, which has the contact portion to come into contact with a corresponding contact terminal of the electronic part. In this arrangement, when the swinging member is tilted, only the second swinging arm portions of the terminals undergo a deformation, and the first swinging arm portions do not experience much deformation. Therefore, the fatigue experienced by the first swinging arm portions is minimized to improve the durability of the first swinging arm portions. Because the terminal is designed to enable the second swinging arm portion to elastically deform to a substantial degree, the gap created between the contact portions and the holding portions is relatively large, making easy the insertion of the contact terminals of the electronic part. With this electronic-part inspection device, the loading work of the electronic part is made simple and easy.

In the above described electronic-part inspection device, it is preferable that the swinging member further comprise a handle portion (for example, the handle portion 71c described in the following embodiment), which extends upward from the upper end of the swinging member, and that this handle portion be used for tilting the swinging member.

In this arrangement, as the handle portion provided at the upper part of the swinging member is used for tilting the swinging member, the tilting operation of the swinging member becomes simple and easy.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only and thus are not limitative of the present invention.

FIGS. 1(a)~1(c) show a first preferred embodiment of electronic-part inspection device according to the present invention.

FIGS. 3(a)~3(d) show a left terminal-retaining member of the electronic-part inspection device. FIG. 3(a), FIG. 3(b) and FIG. 3(c) are a front view, a plan view and a right side view, respectively, of the left terminal-retaining member while

FIGS. 5(a) and 5(b) show a second preferred embodiment of electronic-part inspection device according to the present invention.

FIGS. 6(a)~6(c) show a left swinging member of the electronic-part inspection device as the second embodiment.

DESCRIPTION OF THE PREFERRED EMBODIMENTS

Now, the present invention is described in reference to preferred embodiments of electronic-part inspection device shown in FIG. 1 through FIG. 6. The electronic-part inspection devices presented here as preferred embodiments are preferably used for inspecting the electrical characteristics of chip capacitors.

First Embodiment

Figure 1A:
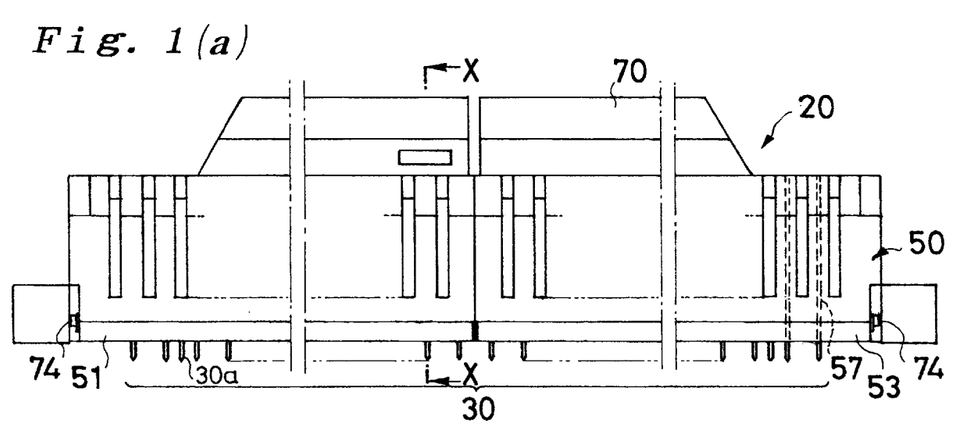
FIG. 1(a), FIG. 1(b) and FIG. 1(c) are a front view, a plan view and a right side view, respectively, of the electronic-part inspection device.
Figure 1B:
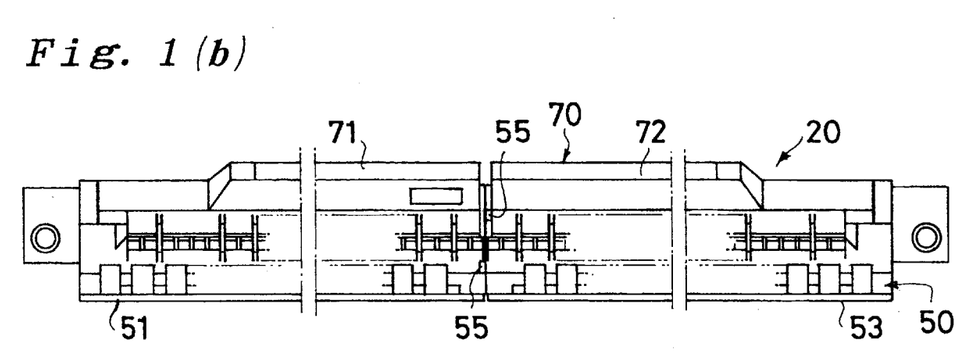
Figure 1C:
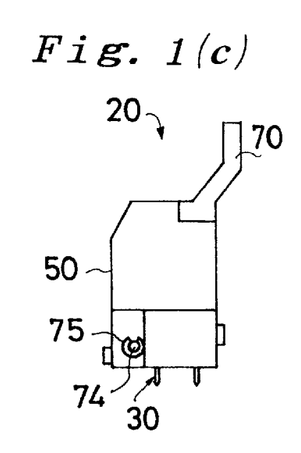
Figure 2:
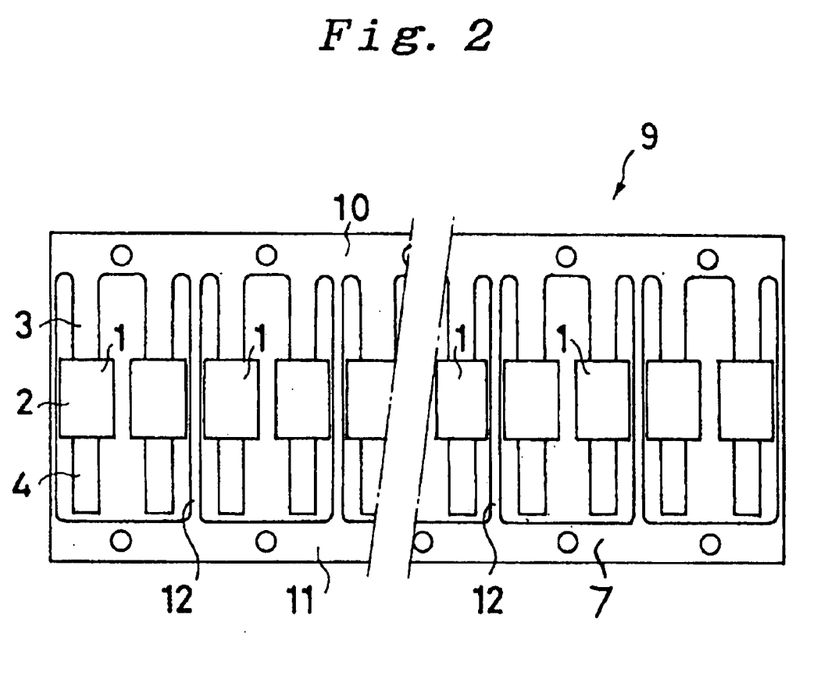
FIG. 2 is a partial front view of a carrier with capacitors, which are to be inspected by the electronic-part inspection device.

Before describing the electronic-part inspection device shown in FIGS. 1–4 as a first preferred embodiment according to the present invention, a chip capacitor to be inspected by the electronic-part inspection device is described. As shown in FIG. 2, the chip capacitor 1 comprises a main body 2, an upper terminal 3, which extrudes upward from the main body 2, and a lower terminal 4, which extrudes downward from the main body 2. A plurality of chip capacitors 1 are aligned on an electrically conductive band-shaped plate material (carrier) 7 at a predetermined pitch in the lateral direction of the drawing and are produced in a lot. A plurality of chip capacitors 1 arranged on a carrier 7 are hereinafter collectively referred to as a "carrier with capacitors 9". In other words, a carrier with capacitors 9 comprises an upper articulating plate 10, a lower articulating plate 11, grounding connection members 12 and a plurality of chip capacitors 1. The upper articulating plate 10 extends horizontally in the drawing and connects electrically the upper terminals 3 of the chip capacitors 1 all together, and the lower articulating plate 11 extends horizontally below the lower terminals 4 of the chip capacitors 1. Each of the grounding connection members 12 extends vertically between the consecutive chip capacitors 1, respectively, and connects the upper articulating plate 10 and the lower articulating plate 11. In this condition, the upper terminals 3 of the chip capacitors 1 are connected electrically to the upper articulating plate 10, the grounding connection members 12 and the lower articulating plate 11 while the lower terminals 4 are not connected even to the lower articulating plate 11 and are isolated electrically. For inspection, the carrier with capacitors 9 is cut into pieces, each having a predetermined length.

Figure 4A:
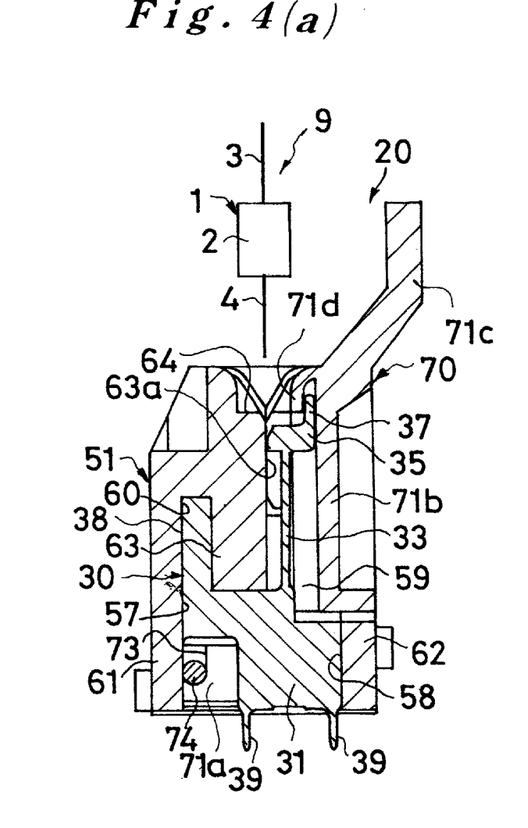
FIG. 4(a) is a sectional view of the electronic-part inspection device, taken along line X—X in FIG. 1(a)

Now, a description is made of the electronic-part inspection device, which is used for inspection of the carrier with capacitors 9. In the following description, for ease of understanding, the three dimensional directions of the electronic-part inspection device 20 are arbitrarily referred as follows. The side of the electronic-part inspection device 20 shown in FIG. 1(a) is the front side of the device, and the upper and lower sides and the right and left sides of the device shown in FIG. 1(a) are accordingly referred to as the upper and lower sides and the right and left sides of the electronic-part inspection device 20, respectively. As shown in FIG. 1, the electronic-part inspection device 20 comprises a plurality of terminals 30, a terminal-retaining member 50 and a swinging member 70. Each terminal 30 is made of an electrically conductive thin plate material in a shape which comprises a terminal base portion 31, a stick-like swinging arm portion 33, a contact portion 35, an engaging portion 37, a rectangular protruding portion 38 and a pair of lead portions 39. The terminal base portion 31 has a rectangular shape and is located in the lower part of the terminal 30, and the swinging arm portion 33 extends upward from the upper central end of the terminal base portion 31. The contact portion 35 is located at the upper end of the swinging arm portion 33, and the engaging portion 37 extends upward from the upper rear end of the contact portion 35. The protruding portion 38 extends upward from the upper front side of the terminal base portion 31, and the lead portions 39, which have a predetermined distance between them, extend downward vertically as shown in FIG. 4(a), which is a sectional view taken along line X—X in FIG. 1(a).

The swinging arm portion 33 of each of the terminals 30 has resiliency and capable of undergoing elastic deformation. Therefore, the swinging arm portions 33 deform elastically around the bases of the swinging arm portions 33 within a predetermined range in the front and rear direction of the electronic-part inspection device 20. The contact portion 35 of each terminal 30 has a rectangular shape with a convex corner on the front side and extends in the front and rear direction.

As shown in FIG. 1(a) and FIG. 1(b), the terminal-retaining member 50 comprises a left terminal-retaining member 51, which is located on the left side, and a right terminal-retaining member 53, which is located on the right side. An engaging convex portion and an engaging concave portion, which are collectively referred to as a connecting part 55, are provided on the right end of the left terminal-retaining member 51 and on the left end of the right terminal-retaining member 53, respectively. When the engaging portions of the connecting part 55 are engaged with each other, the left terminal-retaining member 51 and the right terminal-retaining member 53 are connected in a bilaterally symmetrical condition. Because the left terminal-retaining member 51 and the right terminal-retaining member 53 are bilaterally symmetrical to each other, only the left terminal-retaining member 51 is described in detail in the following, and no further description is given of the right terminal-retaining member 53.

The left terminal-retaining member 51 has a rectangular shape which extends laterally. A plurality of terminal-receiving slots 57, into which the terminals 30 are press-fit, are provided at a predetermined pitch laterally in the width direction of the left terminal-retaining member 51. The shape of each terminal-receiving slot 57 is almost identical with that of the terminal 30 as shown in FIG. 4(a), and each terminal-receiving slot 57 comprises a base-receiving portion 58, which accepts the terminal base portion 31 of the terminal 30, and a swinging space portion 59, which extends widely upward from the rear side of the base-receiving portion 58. The swinging space portion 59 accepts and allows the swinging arm portion 33 of the terminal 30 to swing therein freely. Each terminal-receiving slot 57 further comprises a protrusion-receiving portion 60, which extends upward from the front side of the base-receiving portion 58, and the protrusion-receiving portion 60 accepts the protruding portion 38 of the terminal 30. The base-receiving portion 58 of each terminal-receiving slot 57 is located inside the front wall 61 and the rear wall 62 and below the middle wall 63 of the left terminal-retaining member 51, and the base-receiving portion 58 is open through the bottom of the left terminal-retaining member 51. Also, the swinging space portion 59 is located on the rear side of the middle wall 63 and above the rear wall 62. The rear surface of the middle wall 63, which extends vertically, confronts the contact portions 35 of the terminals 30 (this surface is hereinafter referred to as "counter surface 63a"). In addition, the middle wall 63 has a step 64 at the upper end thereof. In this electronic-part inspection device 20, when a carrier with capacitors 9 is set for inspection, the third terminal 30a from the left side of the inspection device shown in FIG. 1(a) comes into contact with the leftmost grounding connection member 12 of the carrier with capacitors 9 shown in FIG. 2. As shown in FIG. 1(a), the terminal-receiving slot 57 for this terminal 30a is provided at a pitch shorter than that applied for the rest of the terminal-receiving slots 57, and the lead portion 39 of the terminal 30a is electrically grounded. All the terminals 30 are press-fit through the bottoms of the base-receiving portions 58 into the terminal-receiving slots 57 (refer to FIG. 4(a)).

Figure 3A:
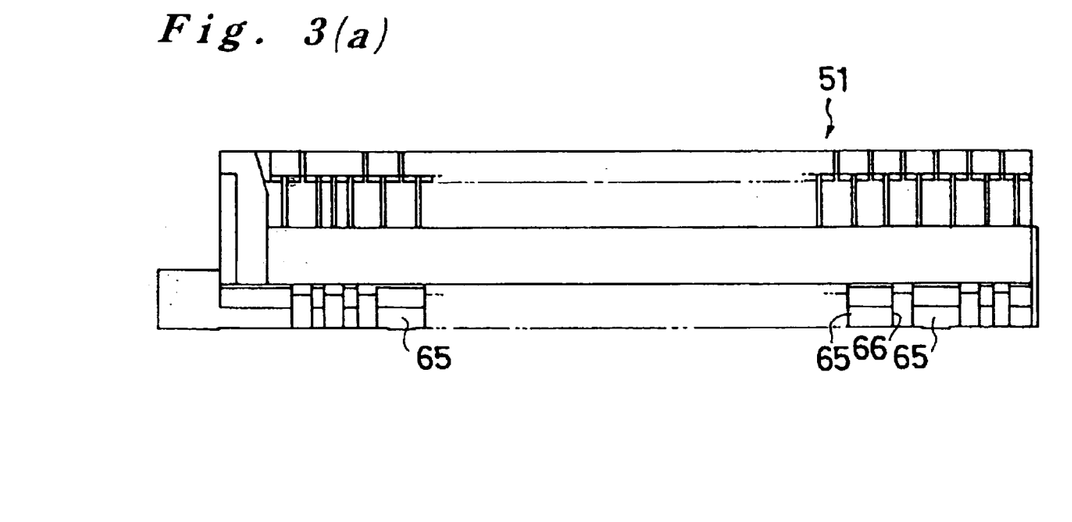
Figure 3B:
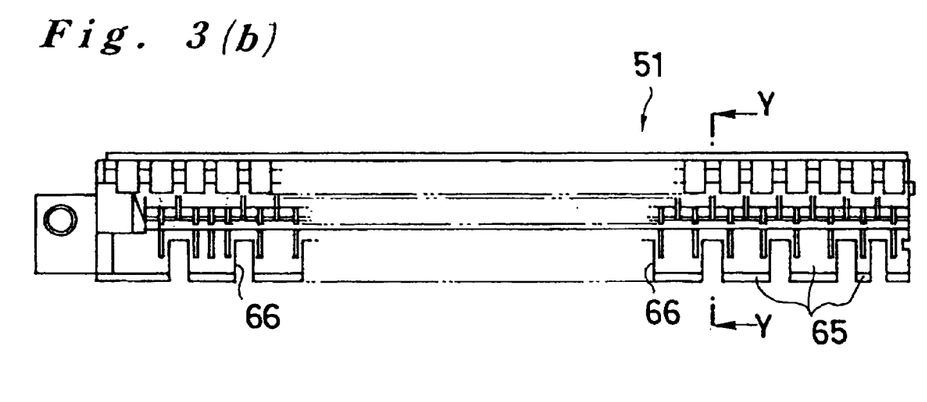
Figure 3C:
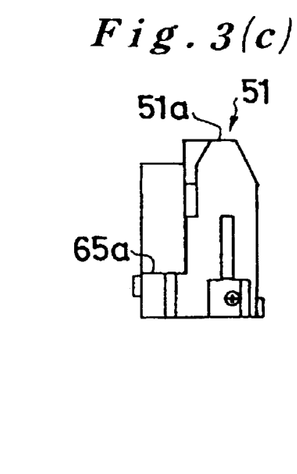
Figure 3D:
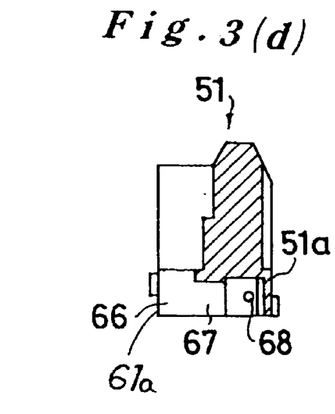
FIG. 3(d) is a sectional view taken along line Y—Y in FIG. 3(b).

As shown in FIG. 3(b), a plurality of rectangular stage portions 65 are provided on the rear side of the left terminal-retaining member 51 at a predetermined pitch laterally in the width direction of the left terminal-retaining member 51 with a plurality of cut-out parts 66, each cut-out part being located between the consecutive stage portions 65, respectively. As shown in FIG. 3(c), the top 65a of the stage portions 65 is lower than the top 51a of the left terminal-retaining member 51. As shown in FIG. 3(d), each of the front ends of the cut-out parts 66 forms a forward recess 67 and extends to the front wall 61a. Furthermore, a retaining through-hole 68, which extends laterally, is provided at the lower front end of the left terminal-retaining member 51 (refer to FIG. 3(d), which is a sectional view taken along line Y—Y in FIG. 3(b)).

Now, a description is made of the swinging member 70, which is assembled pivotally on the terminal-retaining member 50. As shown in FIG. 1(b) and FIG. 4(a), the swinging member 70 comprises a left swinging member 71 and a right swinging member 72, which are laterally symmetrical to each other. Therefore, the left swinging member 71 is described in detail here, and no description is made of the right swinging member 72. The left swinging member 71 is made of an electrically insulative material and extends laterally, i.e., in the width direction of the electronic-part inspection device 20, with a laterally flipped "L" shaped cross-sectional figure. The left swinging member 71 comprises a plurality of horizontal portions 71a, a connecting portion 71b, a handle portion 71c and a plurality of pivotally engaging portions 71d. The horizontal portions 71a are provided at a predetermined pitch laterally, i.e., in the width direction of the left terminal-retaining member 51, each horizontal portion extending forward from the connecting portion 71b, which extends vertically on the rear side of the electronic-part inspection device 20 and functions to keep the horizontal portions 71a connected together. The handle portion 71c extends upward and rearward from the upper end of the connecting portion 71b, and the pivotally engaging portions 71d are provided laterally at the predetermined pitch on the upper front part of the connecting portion 71b. In addition, a through-hole 73 is provided laterally passing through the front ends of the horizontal portions 71a. The left swinging member 71 is mounted pivotally on the left terminal-retaining member 51 by placing the connecting portion 71b of the left swinging member 71 vertically in the swinging space portion 59 of the left terminal-retaining member 51 as shown in FIG. 4(a) and thereby bringing simultaneously the horizontal portions 71a of the left swinging member 71 through the cut-out parts 66 into the recesses 67 of the left terminal-retaining member 51 (refer to FIG. 3) and then by inserting a pin 74 into the retaining through-hole 68 of the left terminal-retaining member 51 and through the through-holes 73 of the left swinging member 71 and finally by attaching snap rings 75 on both the ends of the pin 74 as shown in FIG. 1(c).

As shown in FIG. 4(a), each pivotally engaging portion 71d of the left swinging member 71 has an inversed "V" cross-sectional figure that extends forward a little from the upper front part of the connecting portion 71b and then bends downward with a predetermined clearance from the connecting portion 71b. The lateral pitch of the pivotally engaging portions 71d provided on the left swinging member 71 is the same as that of the terminals 30, which are fixed in the left terminal-retaining member 51.

Now, the operation of the electronic-part inspection device 20 is described in referring to the mounting of the chip capacitors 1 on the electronic-part inspection device 20 by using an automatic loader (not shown). At first, the carrier with capacitors 9 is cut into pieces, so that a plurality of carriers with capacitors 9 are prepared each to have the same number of chip capacitors 1 as the number of the terminals 30 of the electronic-part inspection device 20. Then, the carrier with capacitors 9 prepared for loading is held such that the lower terminals 4 of the chip capacitors 1 in the carrier with capacitors 9 face downward above the electronic-part inspection device 20 at a predetermined position, the carrier with capacitors 9 being aligned laterally with the electronic-part inspection device 20 and being at the middle of the electronic-part inspection device 20 in the front and rear direction as shown in FIG. 4(a). Then, the handle portion 71c of the electronic-part inspection device 20 is pushed rearward as indicated by arrow A in FIG. 4(b). In this instance, the swinging member 70 is rotated around the pin 74 in the direction indicated by arrow B.

Figure 4B:
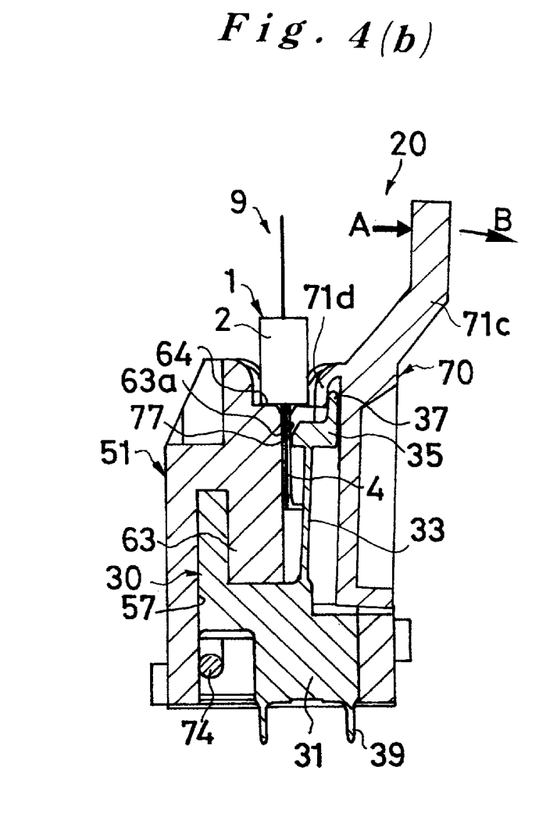
FIG. 4(b) is an illustration to describe the operation of the electronic-part inspection device.

When the swinging member 70 is turned in this way, the pivotally engaging portions 71d move away from the counter surface 63a and cause the swinging arm portions 33 of the terminals 30 to undergo an elastic deformation. As a result, the contact portions 35 of the terminals 30 are positioned away from the counter surface 63a, and a gap 77 is created between the contact portions 35 and the counter surface 63a. Then, the carrier with capacitors 9 is lowered so that the lower terminals 4 of the chip capacitors 1 are inserted into the gap 77. When the lower ends of the main bodies 2 of the chip capacitors 1 come into contact with the step 64 of the middle wall 63 of the electronic-part inspection device 20, the lowering movement of the carrier with capacitors 9 is stopped.

After the lower terminals 4 of the chip capacitors 1 are set in the gap 77, the pushing force keeping the swinging member 70 in this tilted position is released. As a result, the swinging arm portions 33 of the terminals 30, which have been bent elastically, now return to the original positions. Because of this resiliency of the swinging arm portions 33, the contact portions 35 of the terminals 30 and the swinging member 70 are pulled toward the counter surface 63a of the middle wall 63, with the lower terminals 4 of the chip capacitors 1 being sandwiched between the contact portions 35 and the counter surface 63a. In this condition, the lower terminals 4 of the chip capacitors 1 and the terminals 30 of the electronic-part inspection device 20 are electrically connected, each lower terminal 4 being in contact with a corresponding terminal 30.

As described above, according to the electronic-part inspection device 20 presented as a first preferred embodiment, the lower terminals 4 of the chip capacitors 1 are easily brought into electrical connection with the corresponding terminals 30 of the electronic-part inspection device 20 only by inserting the carrier with capacitors 9 into the gap 77 created by the simple operation. After the chip capacitors are set in the inspection device, while one of the inspection terminals of an inspection instrument (not shown) is attached on the terminal 30a shown in FIG. 1(a), which is in electrical connection with a grounding connection member 12 of the carrier with capacitors 9 (refer to FIG. 2), the other inspection terminal of the inspection instrument is then connected to the terminals 30 of the electronic-part inspection device 20, which are in contact with the lower terminals 4 of the chip capacitors 1, one by one in sequence to inspect the electrical characteristics of the individual chip capacitors 1 accurately and reliably.

Second Embodiment

Figure 5A:
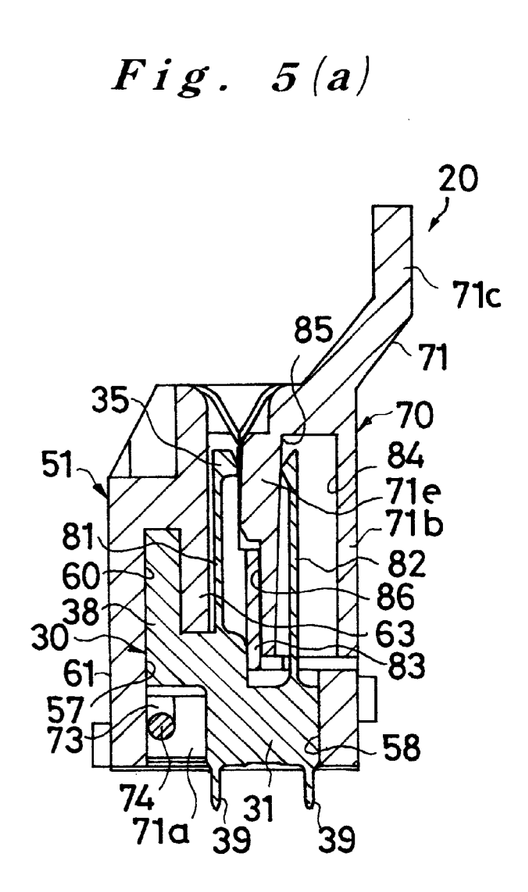
FIG. 5(a) is a sectional view which corresponds to the sectional view taken along line X—X in FIG. 1(a)
Figure 5B:
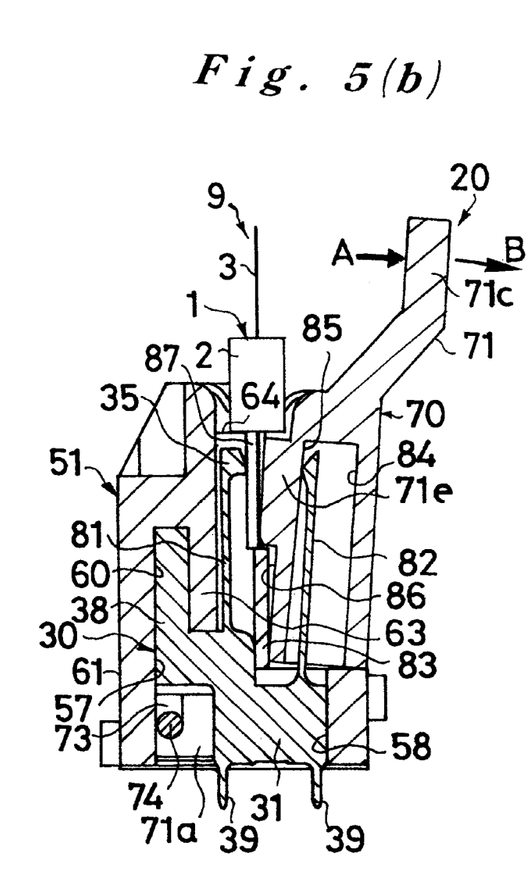
FIG. 5(b) is an illustration describing the operation of the electronic-part inspection device presented as the second embodiment.
Figure 6A:
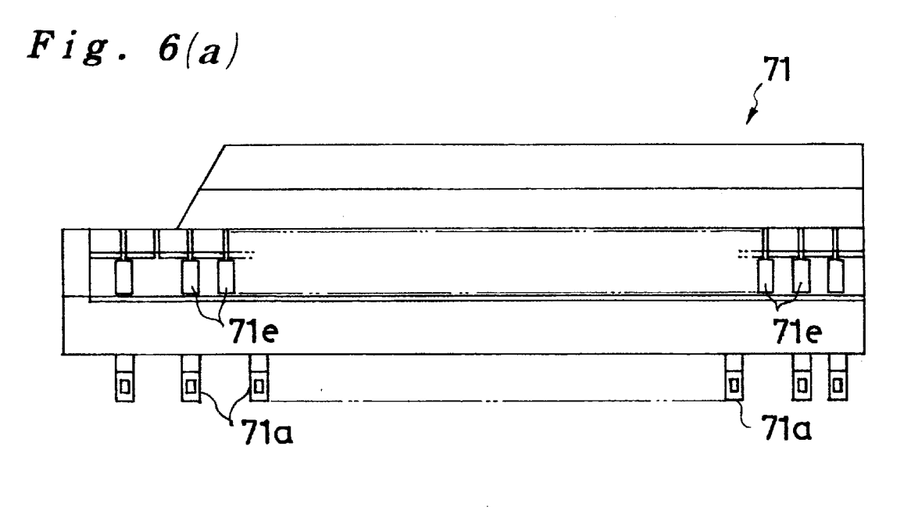
FIG. 6(a), FIG. 6(b) and FIG. 6(c) are a front view, a plan view and a right side view, respectively of the left swinging member.
Figure 6B:
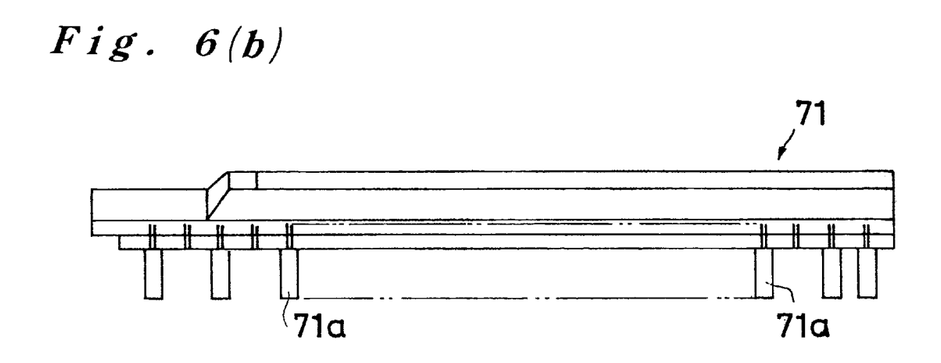
Figure 6C:
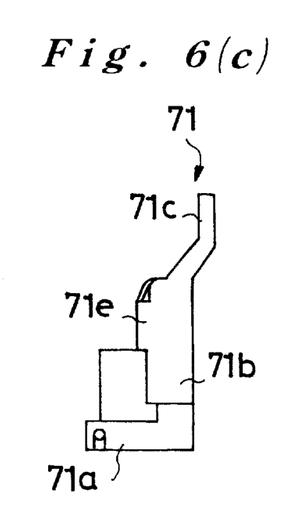

Now, a second embodiment according to the present invention is described in reference to FIG. 5 and FIG. 6. The electronic-part inspection device 20 presented here as the second embodiment has a construction similar to that of the first embodiment, so only the parts of the second embodiment different from those of the first embodiment will be described in the following section, and no description will be offered to the parts which are identical to those of the first embodiment and therefore given the same descriptive numerals. As shown in FIG. 5(a), each terminal 30 comprises a terminal base portion 31, a first swinging arm portion 81, a contact portion 35 and a second swinging arm portion 82. The first swinging arm portion 81, which has resiliency and therefore being capable of undergoing elastic deformation, extends upward from the upper central end of the terminal base portion 31, and the contact portion 35 is located at the upper end of the first swinging arm portion 81. The second swinging arm portion 82, which also has resiliency and therefore being capable of undergoing elastic deformation, extends upward from the upper rear end of the terminal base portion 31.

A stopping member 83 is provided approximately in the middle of the terminal-receiving slots 57 of the left terminal-retaining member 51, and the stopping member 83 with a rectangular cross section extends over the widths of the terminal-receiving slots 57. As shown in FIG. 6, the left swinging member 71 comprises a plurality of holding portions 71e, which are provided laterally at a predetermined pitch on the upper front part of the connecting portion 71b, each holding portion 71e protruding forward. In addition, the left swinging member 71 comprises a plurality of slots 84, which are provided in the connecting portion 71b as shown in FIG. 5(a). The front wall of each slot 84 functions as a pressing surface 85, which pushes the upper front end of the second swinging arm portion 82, and the lower front wall of the connecting portion 71b functions as a counter surface 86, which comes into contact with the stopping member 83.

Now, the operation of the electronic-part inspection device 20 presented as the second embodiment is described in referring to the mounting of the chip capacitors 1 on the electronic-part inspection device 20 by using an automatic loader (not shown). At first, the carrier with capacitors 9 is cut into pieces, so that a plurality of carrier with capacitors 9 are prepared each to have the same number of chip capacitors 1 as the number of the terminals 30 of the electronic-part inspection device 20. Then, the carrier with capacitors 9 prepared by the automatic loader is held such that the lower terminals 4 of the chip capacitors 1 in the carrier with capacitors 9 face downward above the electronic-part inspection device 20 at a predetermined position, the carrier with capacitors 9 being aligned laterally with the inspection device 20 and being at the middle of the inspection device 20 in the front and rear direction. Then, the handle portion 71c of the inspection device 20 is pushed rearward by the automatic loader as indicated by arrow A in FIG. 5(b). In this instance, the left swinging member 71 is rotated around the pin 74 in the direction indicated by arrow B.

When the left swinging member 71 is turned in this way, the holding portions 71e of the left swinging member 71 move away from the contact portions 35 of the terminals 30. Because the left swinging member 71 is rotated in the direction indicated by arrow B, the second swinging arm portions 82 of the terminals 30, whose upper ends are in contact with the pressing surfaces 85 provided in the left swinging member 71, undergo an elastic deformation. As a result, the holding portions 71e of the left swinging member 71 are positioned away from the contact portions 35 of the terminals 30, and a gap 87 is created between the contact portions 35 and the holding portions 71e. Then, the carrier with capacitors 9 is lowered by the automatic loader so that the lower terminals 4 of the chip capacitors 1 are inserted into the gap 87. When the lower ends of the main bodies 2 of the chip capacitors 1 come into contact with the step 64 of the middle wall 63 of the electronic-part inspection device 20, the lowering movement of the carrier with capacitors 9 is stopped. As the second swinging arm portions 82 are capable of being bent elastically to a great degree, the gap 87 between the contact portions 35 and the holding portions 71e is relatively large to achieve easy insertion of the lower terminals 4 of the chip capacitors 1.

After the lower terminals 4 are set in the gap 87, the pushing force keeping the left swinging member 71 in the tilted position is released. As a result, the second swinging arm portions 82 of the terminals 30, which have been bent elastically, now return to the original positions. Because of this resiliency of the second swinging arm portions 82, the holding portions 71e of the left swinging member 71 are pulled toward the contact portions 35 of the terminals 30, with the lower terminals 4 of the chip capacitors 1 being sandwiched between the contact portions 35 and the holding portions 71e. When the counter surface 86 of the left swinging member 71 comes into contact with the stopping member 83 of the left terminal-retaining member 51, the returning motion of the left swinging member 71 stops with the holding portions 71e coming immediately above the stopping member 83. This arrangement effectively prevents any excessive deformation of the first swinging arm portions 81 of the terminals 30. When the holding portions 71e are in this original stopped condition, the first swinging arm portions 81 undergo a little deformation and are bent forward. In this condition, the lower terminals 4 of the chip capacitors 1 are sandwiched between the contact portions 35 of the terminals 30 and the holding portions 71e of the left swinging member 71 with a predetermined contact pressure, which ensures the secure electrical connection between the lower terminal 4 of each chip capacitor 1 and the contact portion 35 of a corresponding terminal 30 of the inspection device 20. Here, it is understood that the operation of the right swinging member 72 shown in FIG. 1, which connects the lower terminals 4 of the chip capacitors 1 to the terminals 30 of the inspection device 20, is exactly the same as that of the left swinging member 71 described above.

In the second embodiment, each of the terminals 30 is provided with the second swinging arm portion 82 in addition to the first swinging arm portion 81 that has the contact portion 35, which comes into contact with a corresponding lower terminal 4 of the chip capacitors 1, and the second swinging arm portion 82 resiliently supports a corresponding holding portion 71e that is used to hold the lower terminal 4. When the left swinging member 71 is tilted, only the second swinging arm portions 82 of the terminals 30 undergo a deformation, and the first swinging arm portions 81 do not experience much deformation. With this arrangement, the fatigue experienced by the first swinging arm portions 81 is minimized to improve the durability of the first swinging arm portions 81. The terminal 30 is designed to enable the second swinging arm portion 82 to elastically deform to a substantial degree, so that the gap 87 created between the contact portions 35 and the holding portions 71e is relatively large, making it easy to insert the lower terminals 4 of the chip capacitors 1.

An electronic-part inspection device according to the present invention, in which the swinging member with the pivotally engaging portions engaging the swinging arm portions of the terminals can be tilted in the front and rear direction as described above, can be applied for inspection of an electronic part. In this case, the contact terminals of an electronic part can be easily brought into electrical connection with the corresponding terminals of the electronic-part inspection device, firstly by tilting the swinging member to bring the pivotally engaging portions away from the counter surface of the terminal-retaining member so as to create a gap between the contact portions and the counter surface, secondly by inserting the contact terminals of the electronic part into the gap, and finally by releasing the swinging member to allow the contact portions of the terminals of the electronic-part inspection device to return to the original positions, i.e., toward the counter surface of the terminal-retaining member, which action causes the contact terminals of the electronic part to be sandwiched between the contact portions of the terminals and the counter surface in the electronic-part inspection device. Furthermore, if an electronic part to be inspected is very small in size, for example, in a case of a chip capacitor, then a plurality of chip capacitors aligned at a relatively short pitch can be mounted in the electronic-part inspection device to easily achieve electrical connection between the contact terminals of the chip capacitors and the corresponding terminals of the electronic-part inspection device.

Another electronic-part inspection device according to the present invention comprises terminals, each of which includes the second swinging arm portion in addition to the first swinging arm portion that has the contact portion, which comes into contact with a corresponding contact terminal of an electronic part. In this case, the second swinging arm portion is used to support resiliently a corresponding holding portion that functions to hold a corresponding contact terminal of the electronic part. When the swinging member is tilted, only the second swinging arm portions of the terminals undergo a deformation, and the first swinging arm portions do not experience much deformation. Therefore, the fatigue experienced by the first swinging arm portions is minimized to improve the durability of the first swinging arm portions. As the second swinging arm portion is designed to elastically deform to a substantial degree, the gap created between the contact portions of the terminals and the holding portions of the inspection device is relatively large, making it easy to insert the contact terminals of the electronic part. As a result, the loading work of the electronic parts for inspection can be carried out relatively easily.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

RELATED APPLICATIONS

This application claims the priority of Japanese Patent Application No. 2000-326623 filed on Oct. 26, 2000, which is incorporated herein by reference.

What is claimed is:

1. An electronic- part inspection device comprising a plurality of vertically extending terminals made of an electrically conductive plate material and being planar, having opposite major faces and edges extending between the opposite major faces, a terminal-retaining member made of an electrically insulative material, which retains said terminals in a laterally extending alignment, and a separately formed swinging member made of an electrically insulative material, which also extends laterally and is connected pivotally on said terminal retaining member so that said swinging member can be swung in a back and forth direction with respect to said terminal-retaining member;

wherein:

each of said terminals comprises a terminal base portion, a swinging arm portion, a contact portion with a contact edge and an engaging portion, said terminal base portion being a lower part of said terminal and retained in said terminal-retaining member, said swinging arm portion extending upward from said terminal base portion and being capable of undergoing elastic deformation to swing in the back and forth direction in the plane of the terminal, said contact portion being located at an upper end of said swinging arm portion, and said engaging portion being also located at the upper end of said swinging arm portion;

said terminal-retaining member comprises a terminal-retaining portion and a counter portion having a flat surface, said terminal-retaining portion retaining said terminal base portions of said terminals and said counter portion being connected to said terminal-retaining portions and located in front of and with the surface therof in engagement with contact edges of said contact portions of said terminals;

said swing member, which has pivotally engaging portions to engage with engaging portions of said terminals, is positioned behind and against said contact portions of said terminals;

when said swinging member is tilted in a direction that causes said pivotally engaging portions of said swing member to move away from said contact portion, said swinging arm portions of said terminals which are engaged through said engaging portion of said terminal to said pivotally engaging portions, undergo an elastic deformation to bring said contact edges of said contact portions of said terminals away from said surface of said counter portion of said terminal-retaining member thereby creating a gap between said contact edges of said contact portions and said surface of said counter portion; and after contact terminals of an electronic part are inserted into said gap, when said tilted swinging member is released to allow said swinging arm portions in said elastic deformation to resume original positions, said contact portions of said terminals and said swinging member are returned toward said counter portion of said terminal-retaining member, said contact terminals of said electronic part are sandwiched between and directly engaged by said contact edges of said contact portions of said terminals and said surface of said counter portion.

2. The electronic-part inspection device set forth in claim 1, wherein said swinging member further comprises a handle portion, which extends upward from an upper end of said swinging member, and said handle portion is used for tilting said swinging member.

3. The electronic-part inspection device set forth in claim 2, said electronic part comprises a plurality of chip capacitors and a metal carrier of ladder-strip construction having opposed longitudinal strip portions bridged transversely by thin earthing strips, each chip capacitor having a main body, an upper terminal and a lower terminal extending from an upper end and a lower end, respectively, of said main body, and said upper terminals of said chip carriers being aligned and connected to said carrier, at locations adjacent and between the thin earthing strips.

4. The electronic-part inspection device set forth in claim 1, wherein said electronic part comprises a plurality of chip capacitors and a metal carrier of ladder-strip construction having opposed longitudinal strip portions bridged transversely by thin earthing strips, each chip capacitor having a main body, an upper terminal and a lower terminal extending from an upper end and a lower end, respectively, of said main body, and said upper terminals of said chip carriers being aligned and connected to said carrier, at locations adjacent and between the thin earthing strips.

5. An electronic- part inspection device comprising a plurality of vertically extending terminals made of an electrically conductive plate material and being planar, having opposite major faces and edges extending between the opposite major faces, a terminal-retaining member made of an electrically insulative material, which retains said terminals in a laterally extending alignment, and a separately formed swinging member made of an electrically insulative material, which also extends laterally and is connected pivotally on said terminal retaining member so that said swinging member can be swung in a back and forth direction with respect to said terminal-retaining member;

wherein:

each of said terminals comprises a terminal base portion, a first swinging arm portion, a contact portion with a contact edge and a second swinging arm portion, said terminal base portion extending in a front and rear direction in lower part of said terminal and being retained in said terminal-retaining member, said first swinging arm portion extending upward from an upper front of said terminal base portion and being capable of undergoing elastic deformation for swinging, said contact portion being located at an upper end of said first swinging arm portion, and said second swinging arm portion extending upward from an upper rear end of said terminal base portion and being capable of elastic deformation for swinging;

said terminal-retaining member comprises a terminal-retaining portion to retain said terminal base portions of said terminals;

said swinging member comprises holding and pressing portions having flat, front surfaces, which are positioned behind and against said contact edges of said contact portions of said terminals, and rear surfaces positioned in front of and against said second swinging arm portions;

when said swinging member is tilted in a direction that causes said holding and pressing portions of said swinging member to move away from said first swinging arm portions of said terminals, said second swinging arm portions of said terminals, which are pushed by said rear surfaces of said holding and pressing portions of said swinging member, undergo an elastic deformation to bring said front surface of said holding and pressing portions away from said contact edges of contact portions of said terminals thereby creating a gap between said holding portions and said contact portions; and after contact terminals of an electronic part are inserted into said gap, when said tilted swinging member is released to allow said second swinging arm portions in said elastic deformation to resume original positions, said swinging member, whose holding and pressing portion is pushed by said second swinging arm portions toward said contact edges of said contact portions of said terminals, is returned toward said first swinging arm portions of said terminals, whereby said contact terminals of said electronic part are sandwiched between and directly engaged by said contact edges of said contact portions of said terminals and said front surfaces of said holding and pressing portions of said swinging member.

6. The electronic-part inspection device set forth in claim 5, wherein said swinging member further comprises a handle portion, which extends upward from an upper end of said swinging member, and said handle portion is used for tilting said swinging member.

7. The electronic-part inspection device set forth in claim 6, wherein said electronic part comprises a plurality of chip capacitors and a metal carrier of ladder-strip construction having opposed longitudinal strip portions bridged transversely by thin earthing strips, each chip capacitor having a main body, an upper terminal and a lower terminal extending from an upper end and a lower end, respectively, of said main body, and said upper terminals of said chip carriers being aligned and connected to said carrier, at locations adjacent and between the thin earthing strips.

8. The electronic-part inspection device set forth in claim 5, wherein said electronic part comprises a plurality of chip capacitors and a metal carrier of ladder-strip construction having opposed longitudinal strip portions bridged transversely by thin earthing strips, each chip capacitor having a main body, an upper terminal and a lower terminal extending from an upper end and a lower end, respectively, of said main body, and said upper terminals of said chip carriers being aligned and connected to said carrier, at locations adjacent and between the thin earthing strips.

* * * * *